United States Patent [19]

Maekawa et al.

[11] Patent Number: 4,490,496

[45] Date of Patent: Dec. 25, 1984

[54] MOISTUREPROOF INSULATING COATING COMPOSITION FOR PACKING CIRCUIT BOARDS

[75] Inventors: Iwao Maekawa; Eiji Omori; Isao Uchigasaki; Hideyuki Tobita; Naoki Yokoyama; Seikichi Tanno; Fumio Nakano; Ren Ito, all of Hitachi, Japan

[73] Assignees: Hitachi Chemical Co., Ltd.; Hitachi, Ltd., both of Tokyo, Japan

[21] Appl. No.: 470,564

[22] Filed: Feb. 28, 1983

Related U.S. Application Data

[63] Continuation of Ser. No. 256,109, Apr. 21, 1981, abandoned.

[30] Foreign Application Priority Data

Apr. 21, 1980 [JP] Japan .................................. 55-53436

[51] Int. Cl.³ .......................... C08K 3/34; C08K 3/20; C08K 5/10; C08L 33/10
[52] U.S. Cl. .................... 524/317; 252/570; 427/96; 524/364; 524/377; 524/386; 524/430; 524/433
[58] Field of Search ....................... 252/570, 572, 573; 427/96; 524/560, 589, 590, 364, 365, 386, 379, 377, 315, 317, 433, 430

[56] References Cited

U.S. PATENT DOCUMENTS

| | | | |
|---|---|---|---|
| 2,993,949 | 7/1961 | Moebius | 427/116 |
| 3,625,758 | 12/1971 | Stahl | 428/901 |
| 3,738,862 | 6/1973 | Klarquist | 427/386 |
| 3,963,798 | 6/1976 | Miller | 427/386 |
| 4,063,002 | 12/1977 | Wilson, Jr. | 428/411 |
| 4,064,287 | 12/1977 | Lipson | 427/96 |
| 4,085,236 | 4/1978 | Ishibashi | 524/562 |
| 4,230,844 | 10/1980 | Chang | 524/560 |
| 4,278,718 | 7/1981 | Billings | 428/64 |
| 4,371,636 | 2/1983 | Distler | 524/560 |

*Primary Examiner*—Christopher A. Henderson
*Attorney, Agent, or Firm*—Antonelli, Terry & Wands

[57] ABSTRACT

A coating composition comprising (A) a thermoplastic resin having a glass transition temperature of 0° to 80° C., (B) a compound having 2 or more hydroxyl groups in the molecule, (C) a thixotropic agent and (D) a solvent, and said coating composition having a viscosity of 3 to 50 poises at 25° C. and a thixotropy of 2 or more can give a moistureproof insulating coating film with uniform and large thickness and very few bubbles by one-time treatment over packing circuit boards.

11 Claims, No Drawings

MOISTUREPROOF INSULATING COATING COMPOSITION FOR PACKING CIRCUIT BOARDS

This is a continuation of application Ser. No. 256,109, filed Apr. 21, 1981, now abandoned.

BACKGROUND OF THE INVENTION

This invention relates to a moistureproof insulating coating composition for packing circuit boards, more particularly to a moistureproof insulating coating composition for packing circuit boards having slight sags of coating composition and being able to form moistureproof insulating film having uniform film thickness by one treatment.

Heretofore, for moistureproof insulation of a packing circuit board wherein a wiring diagram is printed on a laminated sheet of glass-epoxy resin, paper-phenol resin, or the like and microcomputers, resistors, capacitors, and the like parts are provided thereon, there have been used insulating coating compositions having a viscosity of 2–3 poises at 25° C. But since the thickness of a coating film after cured is about 20–50 μm, in order to obtain reliability of moistureproof insulating protection, coating and drying of coating composition is generally repeated for 2–5 times to give a film thickness of 100–150 μm. Therefore, such a process has disadvangtages not only in making the working procedures complicated and processing cost high but also in generating easily bubbles due to the wet-on-wet coating and lowering insulating properties due to inclusion of moisture and the like in the bubbles. On the other hand, in order to thicken a coating film by a one-step coating procedure, there can be used a coating composition having a high viscosity. But when the viscosity is simply increased, sags of the coating composition are taken place so often that there arises another defect in that a constant thickness of coating film cannot be attained. Therefore, there is no coating composition practically suitable for the one-step coating procedure.

SUMMARY OF THE INVENTION

It is an object of this invention to provide a moistureproof insulating coating composition for packing circuit boards, said coating composition being able to give a uniform and thick coating film by one-time dipping with very slight sags while sufficiently maintaining insulation reliability, overcoming the disadvantages mentioned above.

This invention provides a moisture proof insulating coating composition for packing circuit boards comprising
- (A) 20 to 60 parts by weight of a thermoplastic resin having a glass transition temperature (Tg) of 0° to 80° C.,
- (B) 0.01 to 1 part by weight of a compound having two or more hydroxyl groups in the molecule,
- (C) 0.1 to 10 parts by weight of a thixotropic agent, and
- (D) 40 to 80 parts by weight of a solvent, and said coating composition having a viscosity of 3 to 50 poises at 250° C. and a thixotropy of 2 or more.

PREFERRED EMBODIMENT OF THE INVENTION

As the thermoplastic resin (A), there can be used acrylic resins such as homopolymers or copolymers of alkyl esters of acrylic acid or methacrylic acid, urethane resins such as polyaddition reaction products of polyester polyols, polyether polyols, polybutadienes having terminal hydroxyl groups, or the like and various diisocyanates, epoxy resins of novolac or bisphenol type, oil modified or non-oil modified polyester resins which are generally called alkyd resins, and the like. These thermoplastic resins can be used alone or as a mixture thereof.

These thermoplastic resins should have a glass transition temperature of 0° to 80° C. If the glass transition temperature is lower than 0° C., stickiness is retained in a coating film after dried, while if the glass transition temperature is higher than 80° C., a coating film becomes rigid and peeling of the coating film or cracks in the coating film readily takes place. More preferable glass transition temperature is 5° to 30° C. The amount of the thermoplastic resin should be 20 to 60 parts by weight. If the amount is less than 20 parts by weight, sufficient film thickness cannot be obtained, while if the amount is more than 60 parts by weight, workability of the coating composition becomes worse. More preferable amount of the thermoplastic resin (A) is 30 to 50 parts by weight.

As the compound (B) having 2 or more hydroxyl groups in the molecule, there can be used dihydric alcohols such as ethylene glycol, propylene glycol, diethylene glycol, dipropylene glycol; trihydric alcohols such as glycerin; vegetable oils having two or more hydroxyl groups in the molecule such as castor oil; surface active agents having two or more hydroxyl groups in the molecule such as polyoxyethylene sorbitan monolaurate (Tween-20, a trade name, manufactured by Kao-Atlas Co., Ltd.), and the like. These compounds can be used alone or as a mixture thereof.

The compound (B) having 2 or more hydroxyl groups in the molecule is used in an amount of 0.01 to 1 part by weight. If the amount is less than 0.01 part by weight, sufficient thixotropy cannot be obtained, while if the amount is more than 1 part by weight, electrical properties of the coating composition are lowered. More preferable amount of the compound (B) is 0.05 to 0.5 part by weight.

As the thixotropic agent (C), there can be used powdered silicon oxide (AEROSIL #380, a trade name, manufactured by Nippon Aerosil Co., Ltd.), a powdered mixture of magnesium oxide and silicon oxide (Calidria ASBESTOS, a trade name, manufactured by Union Carbide Corp.), aluminum hydroxide (HIGILITE, a trade name, manufactured by Showa Denko K.K.), and the like. These thixotropic agents can be used alone or as a mixture thereof.

The thixotropic agent is preferably mixed with the thermoplastic resin and the solvent previously, and the mixture is dispersion mixed by using a three-roll mill to give a high concentration paste, which is then mixed with the other component. The thixotropic agent is used in an amount of 0.1 to 10 parts by weight. If the amount is less than 0.1 part by weight, the desirable thixotropy cannot be given, while if the amount is more than 10 parts by weight, electrical properties under wet state is lowered. More preferable amount of the thixotropic agent is 0.5 to 5 parts by weight.

As the solvent (D), there can be used ketones such as acetone, methyl ethyl ketone; aromatic series solvents such as toluene, xylene; ester series solvents such as ethyl acetate, butyl acetate; alcohols such as ethanol, butanol, and the like. These solvents can be used alone or as a mixture thereof.

The solvent is used in an amount of 40 to 80 parts by weight. If the amount is less than 40 parts by weight, workability of the coating composition becomes worse, while if the amount is more than 80 parts by weight, sufficient film thickness cannot be obtained. More preferable amount of the solvent is 50 to 70 parts by weight.

The coating composition should have a viscosity of 3 to 50 poises at 25° C. and a thixotropy of 2 or more. The viscosity and thixotropy can be measured by using a Brookfield type viscometer acording to JIS K 6901. If the viscosity is less than 3 poises at 25° C., a thick coating film cannot be obtained by one-time coating, while if the viscosity is more than 50 poises, the coating composition not only becomes difficult in handling for working but also includes much more bubbles. If the thixotropy is less than 2, the coating composition becomes insufficient in prevention of sagging, uniformity in coating films, and the like. More preferable viscosity is 10 to 30 poises at 25° C. and more preferable thixotropy is 3 to 6.

The moistureproof insulating coating composition for packing circuit boards of this invention is effective for moistureproof insulating protection of various kinds of packing circuit boards. As coating processes for these packing circuit boards, there can be used conventional processes such as a brush coating process, a dipping process, a spray coating process, and the like. After the coating, the resulting coating film can be dried at room temperature or with heating depending on the kind of a solvent used.

This invention is illustrated by way of the following Examples, in which all parts and percents are by weight unless otherwise specified.

EXAMPLES 1 TO 3 AND COMPARATIVE EXAMPLES 1 AND 2

(1) Synthesis of Acrylic Resin (a)

In a 1-liter four-necked separable flask, 214 parts of butyl methacrylate, 25 parts of butyl acrylate and 150 parts of toluene were placed and the contents of the flask was heated to 90° C. and maintained at that temperature while passing nitrogen gas therethrough. Then, a mixed solution of 200 parts of butyl methacrylate, 21 parts of butyl acrylate, and 3.0 parts of azobisisobutyronitrile was added dropwise to the flask in 2 hours while conducting the polymerization. Thereafter, the temperature was raised to 110° C. and maintained at that temperature for 2 hours. After completion of the polymerization, the contents of the flask was cooled and when the temperature was lowered to 50° C., 200 parts of toluene was added thereto and stirred for 10 minutes to give a uniform solution. Using this solution, a film of 25 μm thick was formed to measure a glass transition temperature (Tg) by the penetration process using TMS (a thermally physical tester) to give Tg of 12° C.

(2) Synthesis of Urethane Resin (b)

In a 2-liter four-necked flask, 650 parts of a polybutadiene having terminal hydroxyl groups (NISSO-PBG 1000, a trade name manufactured by Nippon Soda Co., Ltd.), 174 parts of tolylene diisocyanate, 824 parts of toluene, and 1.4 parts of dibutyl tin laurate were placed and reacted at 60° C. for 3 hours and at 80° C. for 3 hours while taking care of the generation of heat to give a urethane resin having 0.1% of free NCO (determined by infrared spectrum). Using this resin, a film of 25 μm thick was formed to measure a glass transition temperature (Tg) by the penetrating process using TMS to give Tg of 53° C.

(3) Synthesis of Thixotropic Agent Added Thermoplastic Resin Paste

To each 90 parts of thermoplastic resin solution obtain in (1) and (2) mentioned above, each 10 parts of AEROSIL #380 was mixed. Then the mixture was passed through a three-roll mill for 3 times to give thermoplastic resin pastes (a) and (b) having 10% of AEROSIL #380.

Moistureproof insulating coating compositions for packing circuit boards as shown in Table 1 were obtained. These coating compositions were coated on packing circuit boards of 120 mm × 150 mm mounting a microcomputer, resistor and capacitor and surface appearance, thickness of coating films and amounts of sagging of coating compositions were measured. As a coating process, a dipping process of whole surfaces was employed. Drying was carried out by hanging each packing circuit board on one point at 40° C. for 6 hours. The results are as shown in Table 2. The lower and upper portions of the coating film are denoted depending on those when hung during the drying.

TABLE 1

| Example No. | Example 1 | Example 2 | Example 3 | Comparative Example 1 | Comparative Example 2 |
|---|---|---|---|---|---|
| Materials (parts) | | | | | |
| Acrylic resin (a) | 450 | 350 | — | 500 | 500 |
| Urethane resin (b) | — | — | 450 | — | — |
| Paste of acrylic resin (a) | 50 | 150 | — | — | — |
| Paste of urethane resin (b) | — | — | 50 | — | — |
| Castor oil | 1.5 | — | — | — | — |
| Tween 20 | — | 2.0 | 1.2 | — | — |
| Toluene | 150 | 180 | 180 | 150 | 100 |
| Methyl ethyl ketone | 40 | 60 | 20 | 15 | — |
| Properties | | | | | |
| Viscosity in poises (25° C.) *1 | 24 | 15 | 30 | 2.8 | 2.6 |
| Thixotropy *1 | 3.1 | 5.3 | 2.9 | — | — |

Note
*1: According to JIS K690i

TABLE 2

| | Example 1 | Example 2 | Example 3 | Comparative Example 1 | Comparative Example 2 |
|---|---|---|---|---|---|
| Thickness at central portion | 150 | 130 | 175 | 35 | 90 |

TABLE 2-continued

|  | Example 1 | Example 2 | Example 3 | Comparative Example 1 | Comparative Example 2 |
| --- | --- | --- | --- | --- | --- |
| of coating film (μm) | | | | | |
| Sagging amount of coating composition (g) | 22 | 17 | 26 | 15 | 42 |
| Bubbles in the surface | Few | None | Few | Few | Many |
| Uniformity of coating film | | | | | |
| Thickness of coating film (μm) Lower portion | 165 | 135 | 200 | 50 | 130 |
| Thickness of coating film (μm) Upper portion | 145 | 125 | 165 | 20 | 45 |

Note
(1): Film thickness was measured by using a micrometer.
(2): Sagging amount of coating composition was measured immediately after the packing circuit board was picked up from dipping at 25° C.

As is clear from Table 2, according to the coating composition of this invention, packing circuit boards can be coated with uniformly thick coating film having very few bubbles by one-time dipping, so that the processing can be reduced and the reliability of packing circuit boards can be improved remarkably.

What is claimed is:

1. A moistureproof insulating coating composition for packing circuit boards comprising:
   (A) 20 to 60 parts by weight of a thermoplastic resin having a glass transition temperature of 0° to 80° C., said thermoplastic resin being an acrylic resin obtained by polymerizing alkyl esters of acrylic acid or methacrylic acid alone or a mixture thereof, or a urethane resin;
   (B) 0.01 to 1 part by weight of at least one compound selected from the group consisting of a dihydric alcohol, a trihydric alcohol, a vegetable oil having two or more hydroxyl groups in a molecule and a surface active agent having two or more hydroxyl groups in a molecule;
   (C) 0.1 to 10 parts by weight of at least one thixotropic agent selected from the group consisting of powdered silicon oxide, magnesium oxide, and aluminum hydroxide; and
   (D) 40 to 80 parts by weight of at least one organic solvent; said coating composition having a viscosity of 3 to 50 poises at 25° C. and a thixotropy of 2 or more.

2. A coating composition according to claim 1, wherein the compound (B) is castor oil or polyoxyethylene sorbitan monolaurate.

3. A coating composition according to claim 1, wherein the thixotropic agent is powered silicon oxide.

4. A coating composition according to claim 1, wherein the coating composition has a viscosity of 10 to 30 poises at 25° C. and a thixotropy of 3 to 6.

5. A coating composition according to claim 1, wherein said solvent is at least one member selected from the group consisting of ketones, aromatic series solvents, ester series solvents and alcohols.

6. A coating composition according to claim 1, wherein said composition consists essentially of components (A), (B), (C) and (D).

7. A moistureproof insulating coating composition for packing circuit boards comprising:
   (A) 20 to 60 parts by weight of a thermoplastic resin having a glass transition temperature of 0° to 80° C., said resin being an acrylic resin obtained by polymerizing alkyl esters of acrylic acid or methacrylic acid alone or a mixture thereof, or a urethane resin;
   (B) 0.01 to 1 part by weight of polyoxyethylene sorbitan monolaurate;
   (C) 0.1 to 10 parts by weight of powdered silicon oxide; and
   (D) 40 to 80 parts by weight of a mixture of toluene and methyl ethyl ketone; said coating composition having a viscosity of 3 to 50 poises at 25° C. and a thixotropy of 2 or more.

8. A coating composition according to claim 7, wherein the thermoplastic resin (A) is an acrylic resin.

9. A coating composition according to claim 7, wherein the thermoplastic resin (A) is a urethane resin.

10. A coating composition according to claim 1, wherein the thermoplastic resin (A) is an acrylic resin.

11. A coating composition according to claim 1, wherein the thermoplastic resin (A) is a urethane resin.

* * * * *